(12) United States Patent
Lin (10) Patent No.: US 10,925,173 B1
(45) Date of Patent: Feb. 16, 2021

(54) PROGRAMMABLE AC POWER DISTRIBUTION DEVICE

(71) Applicant: CHYNG HONG ELECTRONIC CO., LTD., Taichung (TW)

(72) Inventor: Mu-Chun Lin, Taichung (TW)

(73) Assignee: CHYNG HONG ELECTRONIC CO., LTD., Taichung (TW)

( * ) Notice: Subject to any disclaimer, the term of this patent is extended or adjusted under 35 U.S.C. 154(b) by 0 days.

(21) Appl. No.: 16/828,816

(22) Filed: Mar. 24, 2020

(51) Int. Cl.
*H05K 7/14* (2006.01)
*H05K 5/00* (2006.01)
*H05K 5/02* (2006.01)
*H05K 7/20* (2006.01)

(52) U.S. Cl.
CPC ......... *H05K 5/0008* (2013.01); *H05K 5/0221* (2013.01); *H05K 5/023* (2013.01); *H05K 7/1432* (2013.01); *H05K 7/1457* (2013.01); *H05K 7/20563* (2013.01)

(58) Field of Classification Search
None
See application file for complete search history.

(56) References Cited

U.S. PATENT DOCUMENTS

| 3,925,710 | A | * | 12/1975 | Ebert | H05K 7/1424 361/690 |
| 5,398,161 | A | * | 3/1995 | Roy | H05K 7/20545 361/679.01 |
| 6,176,710 | B1 | * | 1/2001 | Ewing | H01R 11/283 439/564 |
| 8,982,561 | B2 | * | 3/2015 | Snider | H05K 9/0047 361/704 |
| 9,513,500 | B2 | * | 12/2016 | Lin | G02F 1/13452 |
| 9,538,679 | B1 | * | 1/2017 | Lin | H05K 7/1432 |
| 9,674,973 | B1 | * | 6/2017 | Lin | H05K 7/1432 |
| 10,063,038 | B1 | * | 8/2018 | Lin | H02B 1/24 |
| 2004/0160720 | A1 | * | 8/2004 | Yamanashi | G11B 33/142 361/103 |
| 2019/0273366 | A1 | * | 9/2019 | Huang | H02G 5/025 |
| 2020/0042050 | A1 | * | 2/2020 | Degner | G06F 1/206 |
| 2020/0077532 | A1 | * | 3/2020 | Fujiki | H05K 7/209 |

* cited by examiner

*Primary Examiner* — Courtney L Smith
(74) *Attorney, Agent, or Firm* — Sinorica, LLC (57) ABSTRACT

A programmable AC power distribution device includes a control circuit board disposed on a connecting plate. A fixing plate is disposed in a case. The connecting plate is connected to the fixing plate through a coupling member. Thereby, the connecting plate with the control circuit board can be disassembled only by removing the coupling member. When the control circuit board is to be reinstalled, the connecting plate can be easily fixed to the fixing plate through the coupling member. The assembly and disassembly of the control circuit board can be improved effectively, thereby greatly improving the efficiency of the check and repair of the control circuit board.

9 Claims, 7 Drawing Sheets

PROGRAMMABLE AC POWER DISTRIBUTION DEVICE

FIELD OF THE INVENTION

The present invention relates to a power distribution device, and more particularly to a programmable AC power distribution device.

BACKGROUND OF THE INVENTION

For the current trend of "computerization, digitization and intelligence" of Industry 4.0, the inventor of the present invention invented a programmable AC power distribution unit, as disclosed in U.S. Pat. No. 10,063,038. It can monitor the data of the input power and automatically control the opening and closing of the distributed power, thereby improving the problems that the power management and monitoring through manual detection and improving the quality of power and controlling the safety of power.

However, the case of the programmable AC power distribution unit has a plurality of electronic components, such as a control circuit board, a bus bar assembly, an electromagnetic switch, and the like. The control circuit board is directly fixed on a fixing plate, and the fixing plate is locked to the case. If the circuit control board is to be dismantled, it must be removed together with the fixing plate. The fixing plate is locked to the case and is not easy to disassemble, which causes the maintenance of the control circuit board to be difficult. Accordingly, the inventor of the present invention has devoted himself based on his many years of practical experiences to solve these problems.

SUMMARY OF THE INVENTION

The primary object of the present invention is to provide a programmable AC power distribution device, which can effectively improve the assembly and disassembly of a control circuit board and improve the efficiency of checking and repairing the control circuit board.

In order to achieve the primary object, the present invention provides a programmable AC power distribution device. The programmable AC power distribution device comprises a case. A top plate is provided on top of the case. A control circuit unit is provided in the case. The control circuit unit comprises a fixing plate, a connecting plate, a control circuit board, and at least one coupling member. The fixing plate is fixedly disposed in the case. A bottom edge of the fixing plate is provided with a first fixing portion extending frontward. A top edge of the fixing plate is provided with a connecting portion extending rearward. The rear side of the connecting plate abuts against the front side of the fixing plate. A top edge of the connecting plate is provided with a coupling portion extending rearward and corresponding to the connecting portion of the fixing plate. The control circuit board is locked to a front side of the connecting plate. The at least one coupling member is configured to fix the coupling portion of the connecting plate to the connecting portion of the fixing plate.

In the programmable AC power distribution device provided by the present invention, the connecting plate provided with the control circuit board is fast and easily fixed to the fixing plate through the coupling members. Moreover, the connecting plate can be disassembled only by removing the coupling members. Thereby, the assembly and disassembly of the control circuit board can be effectively improved, thereby greatly improving the efficiency of the check and repair of the control circuit board.

DETAILED DESCRIPTION OF THE PREFERRED EMBODIMENTS

Embodiments of the present invention will now be described, by way of example only, with reference to the accompanying drawings.

Figure 1:
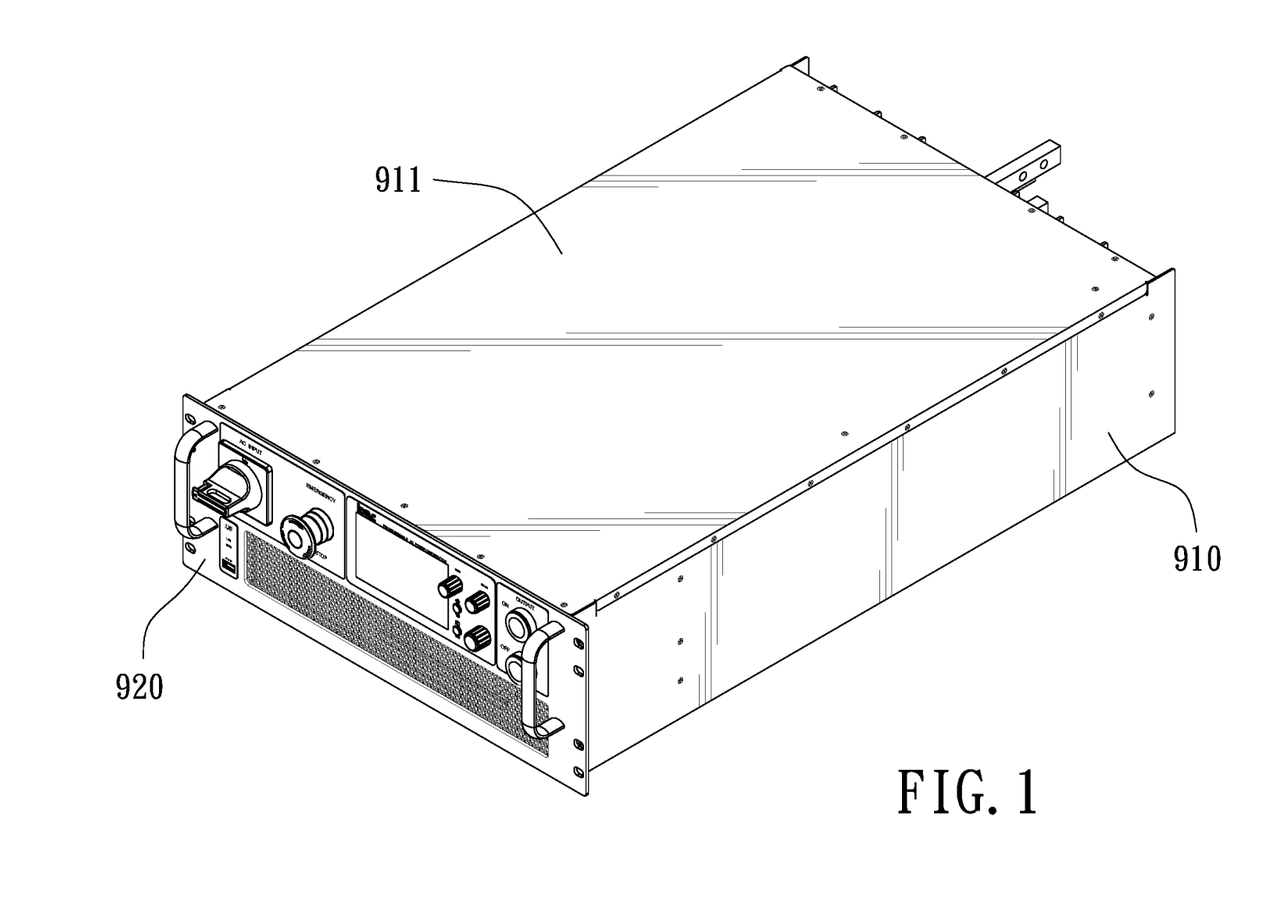
FIG. 1 is a perspective view of the programmable AC power distribution device of the present invention.
Figure 2:
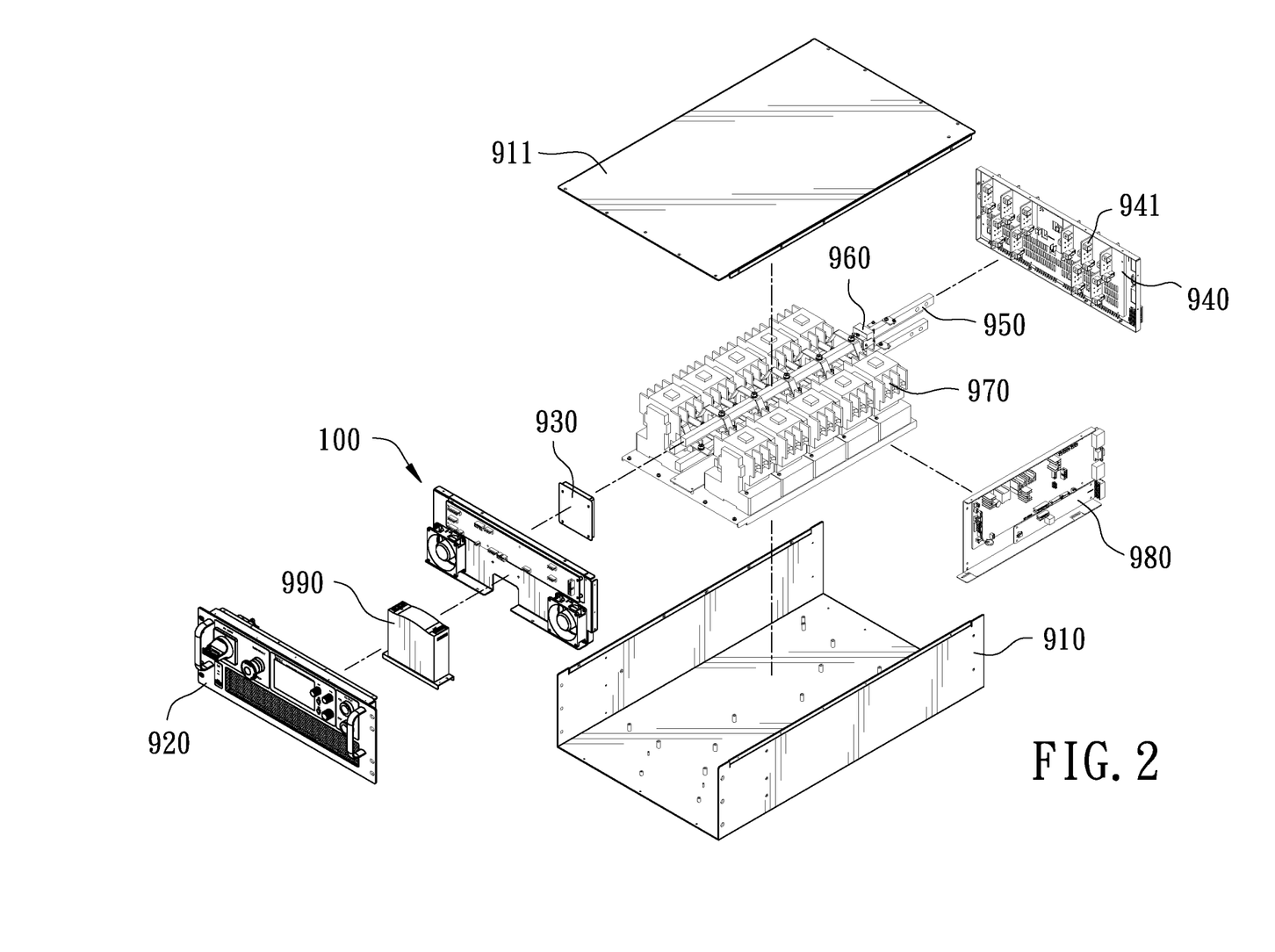
FIG. 2 is an exploded view of the programmable AC power distribution device of the present invention.

As shown in FIG. 1 and FIG. 2, the programmable AC power distribution device of the present invention comprises a case 910. A top plate 911 is disposed on top of the case 910. An operation panel 920 is provided on the front side of the case 910. A back plate 940 is provided on the rear side of the case 910. The back plate 940 is provided with a plurality of output terminals 941. A bus bar assembly 950 is vertically disposed between the operation panel 920 and the back plate 940. An insulting sleeve 930 is provided at the inner end of the bus bar assembly 950. A plurality of current detectors 960 are fitted on the bus bar assembly 950, respectively. A plurality of electromagnetic switches 970 are provided on the left and right sides of the bus bar assembly 950, respectively. A network communication circuit board 980 is disposed on one side of the case 910. A power converter 990 is disposed behind the operation panel 920. Since the foregoing structures are all known technologies, they will not be described hereinafter.

Figure 3:
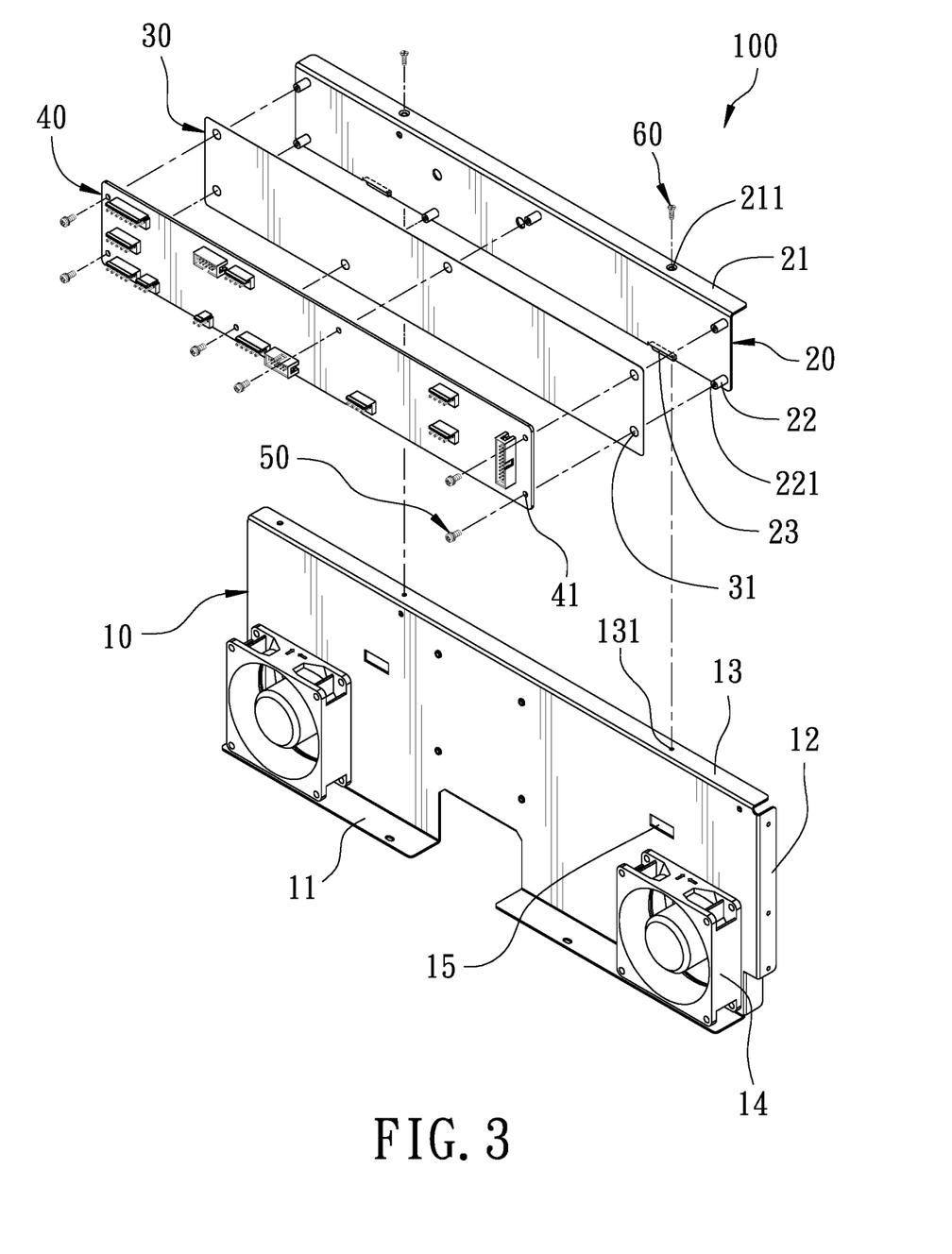
FIG. 3 is an exploded view of the control circuit unit according to a first embodiment of the present invention.
Figure 4:
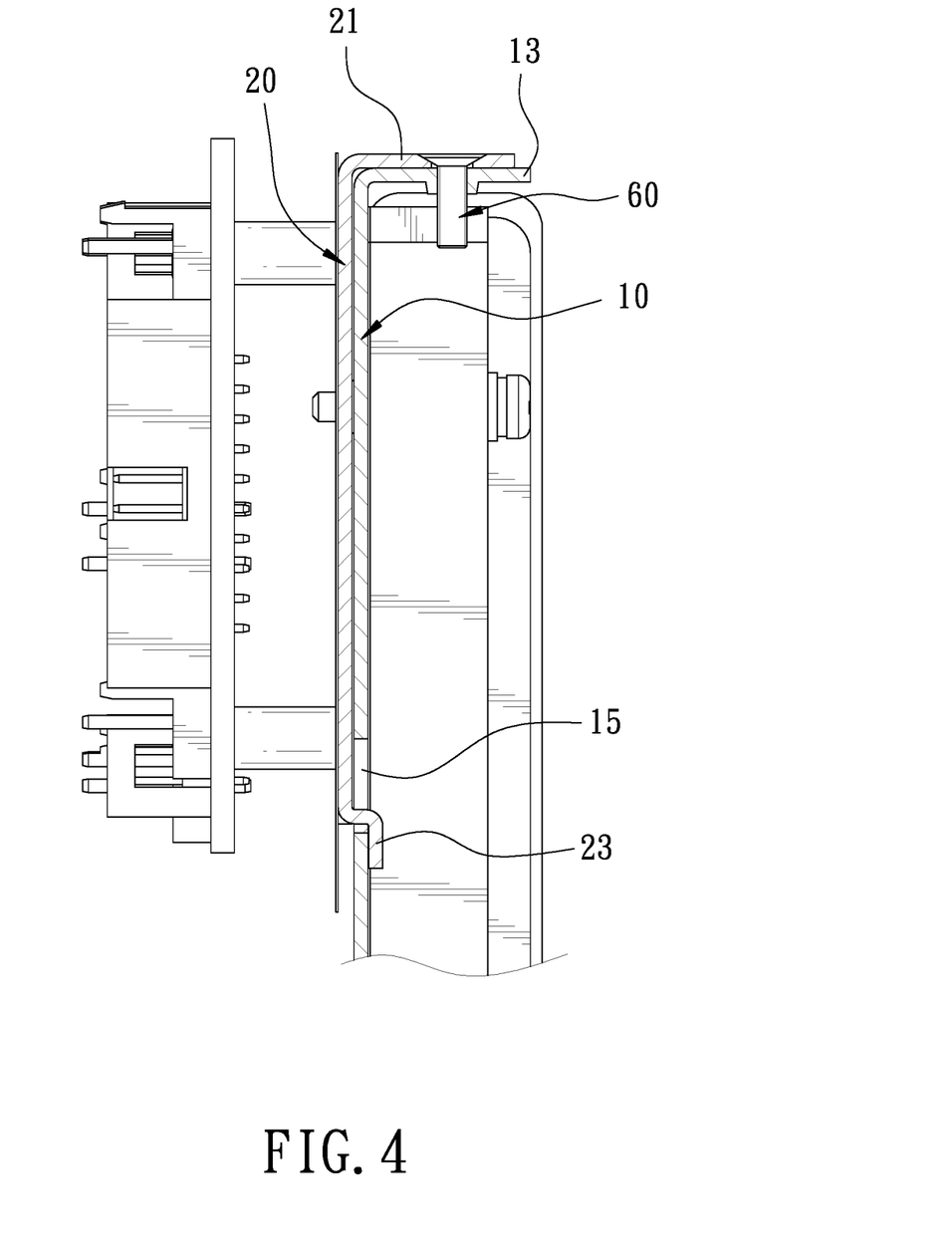
FIG. 4 is a cross-sectional view of the control circuit unit according to the first embodiment of the present invention.

Please refer to FIGS. 2 to 4, illustrating the main improvement of the present invention. The present invention further includes a control circuit unit 100. The control circuit unit 100 is parallel to the operation panel 920 and located between the power converter 990 and the insulating sleeve 930. The control circuit unit 100 includes a fixing plate 10, a connecting plate 20, an insulating plate 30, a control circuit board 40, and a plurality of coupling members 60.

The fixing plate 10 is disposed between the power converter 990 and the insulating sleeve 930. The bottom edge of the fixing plate 10 is provided with a lateral first fixing portion 11 extending forward. The first fixing portion 11 is locked to the bottom of the case 910. The left and right sides of the fixing plate 10 are provided with a pair of longitudinal second fixing portions 12 extending rearward. The second fixing portions 12 are locked to the sides of the case 910 to strengthen the stability of the fixing plate 10. The top edge of the fixing plate 10 is provided with a lateral connecting portion 13 extending rearward. The connecting portion 13 is a flat plate and has a plurality of locking holes 131. A plurality of engaging holes 15 are formed on the front side of the fixing plate 10. The surface of the fixing plate 10 is provided with a plurality of cooling fans 14.

The rear side of the connecting plate 20 abuts against the front side of the fixing plate 10. The top edge of the connecting plate 20 is provided with a lateral coupling portion 21 extending rearward and corresponding to the connecting portion 13 of the fixing plate 10. The coupling portion 21 is also a flat plate, so that the connecting plate 20 can be stably disposed on the fixing plate 10. The coupling portion 21 is provided with a plurality of locking holes 211 corresponding to the locking holes 131 of the connecting portion 13. The bottom edge of the connecting plate 20 is provided with a plurality of engaging pieces 23 extending rearward and corresponding to the engaging holes 15. When the connecting plate 20 is fitted onto the fixing plate 10, the engaging pieces 23 are engaged in the engaging holes 15 to strengthen the stability of the connecting plate 20. A plurality of positioning protrusions 22 are provided on the front side of the connecting plate 20. The positioning protrusion 22 is a cylinder. A locking hole 221 is defined in the positioning protrusion 22.

The insulating plate 30 is disposed on the front side of the connecting plate 20. The insulating plate 30 is provided with a plurality of receiving holes 31 corresponding to the positioning protrusions 22 of the connecting plate 20, so that the positioning protrusions 22 can pass through the receiving holes 31 to position the insulating plate 30.

The control circuit board 40 is disposed on the front side of the insulating plate 30. The control circuit board 40 is provided with a plurality of locking holes 41 corresponding to the positioning protrusions 22. The control circuit board 40 is fixed to the positioning protrusions 22 on the front side of the connecting plate 20 through a plurality of locking members 50 passing through the locking holes 41. The locking members 41 are bolts.

The plurality of coupling members 60 are configured to fix the coupling portion 21 of the connecting plate 20 to the connecting portion 13 of the fixing plate 10. In this invention, the coupling members 60 are bolts. The connecting portion 13 of the fixing plate 10 is provided with locking holes 131. The coupling portion 21 of the connecting plate 20 is provided with locking holes 211 corresponding to the locking holes 131 of the connecting portion 13. The coupling members 60 are inserted through the locking holes 211 of the coupling portion 21 and the locking holes 131 of the connecting portion 13 in order, so that the coupling portion 21 of the connecting plate 20 is locked on the connecting portion 13 of the fixing plate 10 by the coupling members 60.

In order to further understand the structural features, the technical means and the expected effects of the present invention, the operation of the present invention is described in detail below. This will facilitate a deeper and more specific understanding of the present invention.

Figure 5:
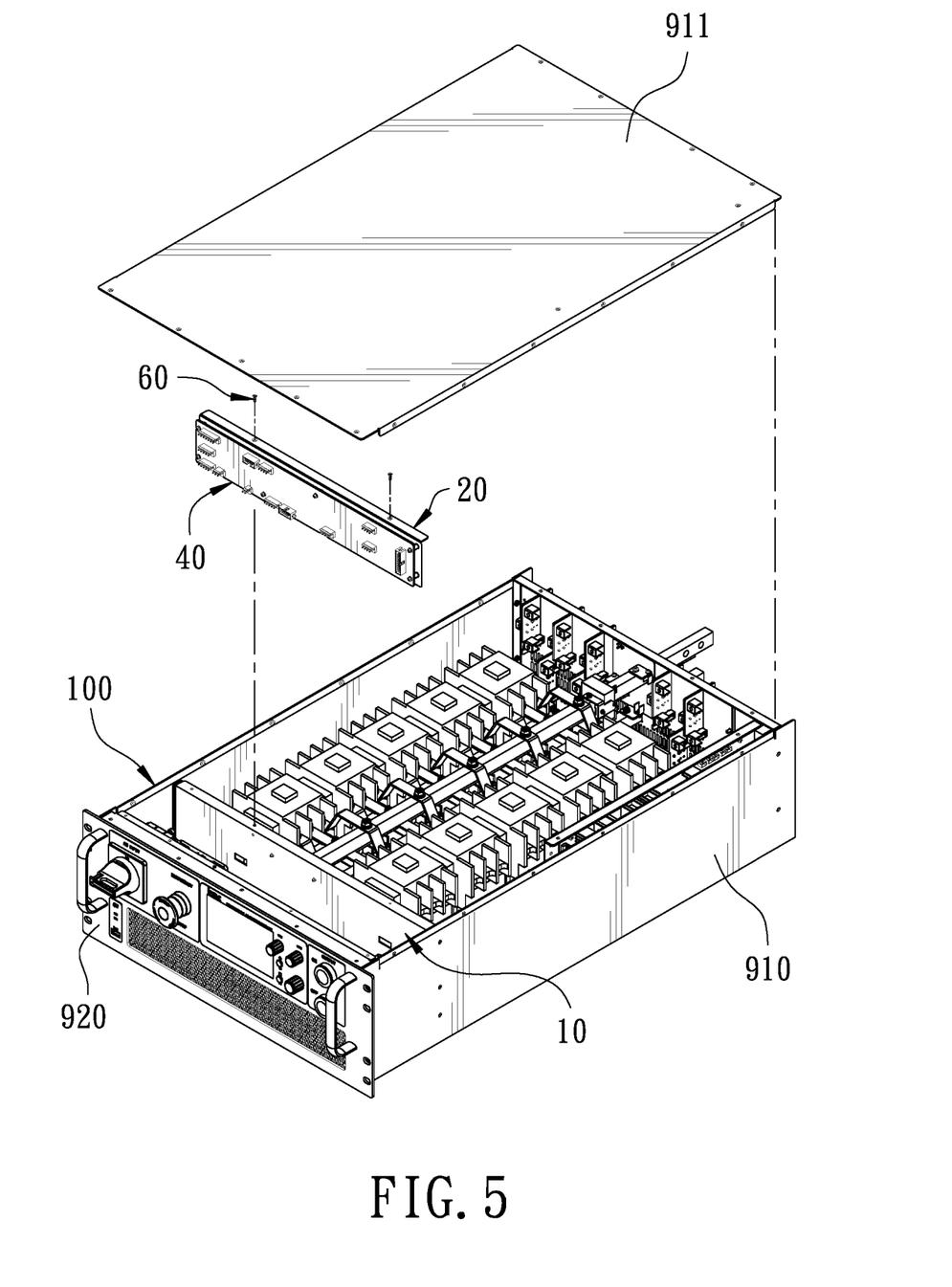
FIG. 5 is a schematic view showing that the control circuit board is removed from the case of the present invention.

Referring to FIG. 5, when the control circuit board 40 of the programmable AC power distribution device needs to be repaired, only the top plate 911 on top of the case 910 needs to be removed, that is, the coupling members 60 are directly removed. Because the control circuit unit 100 is vertically installed in the case 910 and the coupling members 60 are disposed on the top of the control circuit unit 100, the coupling members 60 can be easily removed after the top plate 911 is removed. After the coupling members 60 are removed, the connecting plate 20 can be pulled out, so that the control circuit board 40 locked on the connecting plate 20 can be repaired. After the control circuit board 40 is repaired, the connecting plate 20 can be easily inserted into the case 910 and fitted on the fixing plate 10. The connecting plate 20 provided with the control circuit board 40 is fast and easily fixed to the fixing plate 10 through the coupling members 60. Thereby, the assembly and disassembly of the control circuit board 40 can be improved effectively, thereby greatly improving the efficiency of the check and repair of the control circuit board 40.

Figure 6:
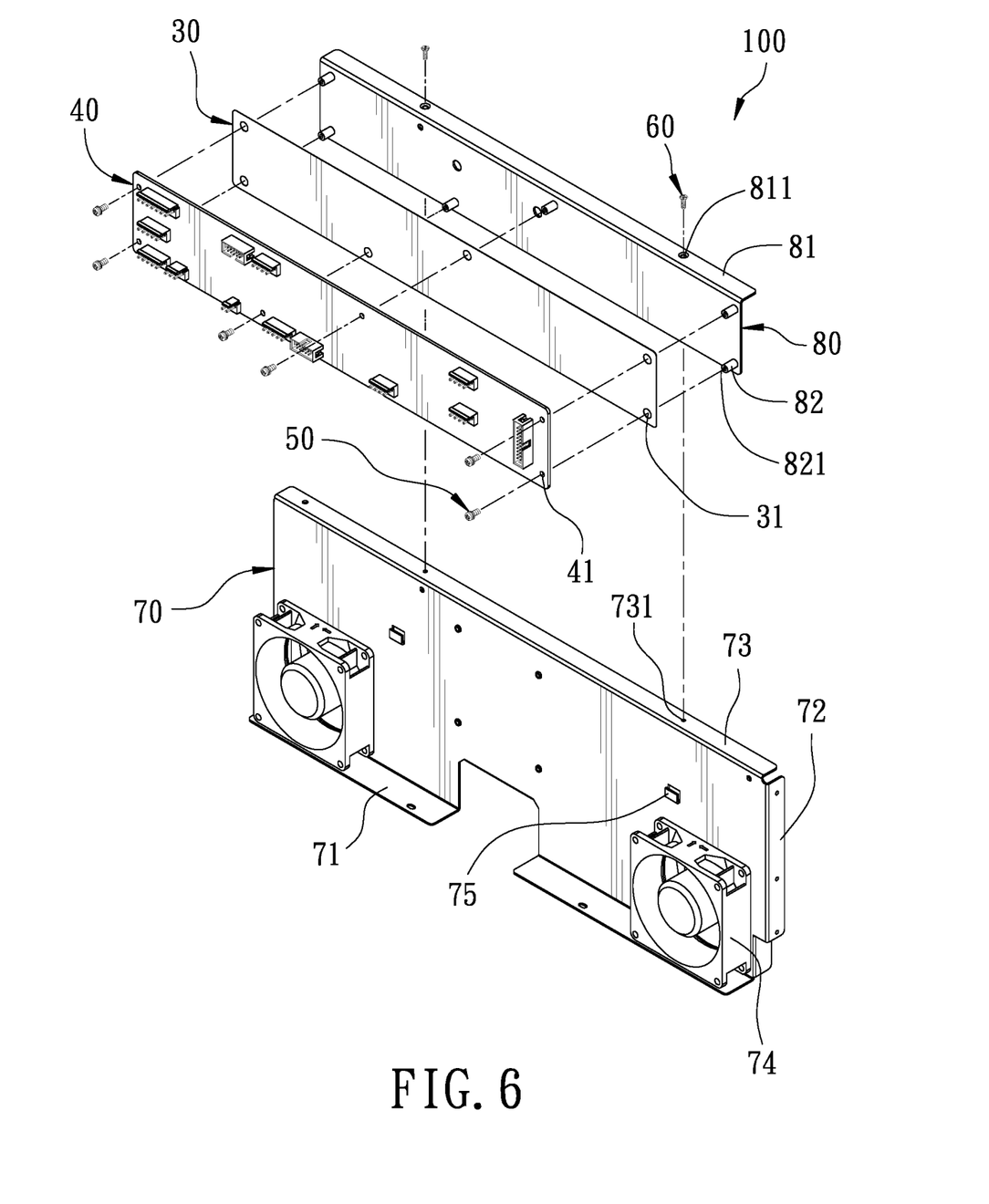
FIG. 6 is an exploded view of the control circuit unit according to a second embodiment of the present invention.
Figure 7:
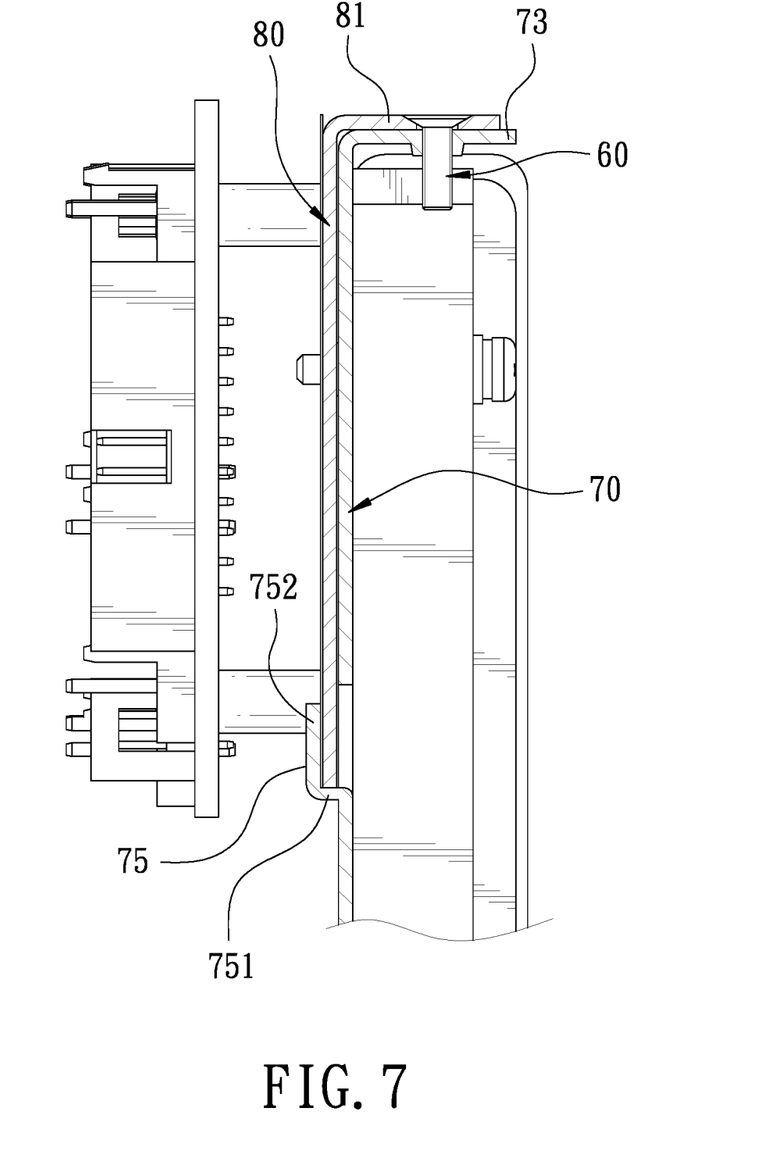
FIG. 7 is a cross-sectional view of the control circuit unit according to the second embodiment of the present invention.

FIG. 6 and FIG. 7 illustrate the control circuit unit according to a second embodiment of the present invention. The second embodiment is substantially similar to the first embodiment with the exceptions described hereinafter.

The bottom edge of the connecting plate 80 is not provided with an engaging structure. The front side of the fixing plate 70 is provided with a plurality of engaging portions 75 corresponding to the bottom edge of the connecting plate 80, so that the bottom edge of the connecting plate 80 can be engaged into the engaging portions 75 for engaging the connecting plate 80. Specifically, each engaging portion 75 includes a holding portion 751 and a limiting piece 752. The holding portion 751 extends forward from the front side of the fixing plate 70 for holding the bottom edge of the connecting plate 80. The limiting piece 752 extends upward from the distal end of the holding portion 751. When the connecting plate 80 is held by the holding portion 751, the connecting plate 80 is confined to be located between the limiting piece 752 and the fixing plate 70, so as to strengthen the stability of the connecting plate 80.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A programmable AC power distribution device, comprising a case, a top plate being provided on top of the case, a control circuit unit being provided in the case, the control circuit unit comprising:
   a fixing plate, fixed in the case, a bottom edge of the fixing plate being provided with a first fixing portion for the fixing plate to be fixed to a bottom of the case, a top edge of the fixing plate being provided with a lateral connecting portion;
   a connecting plate, located on a front side of the fixing plate, a top edge of the connecting plate being provided with a lateral coupling portion corresponding to the connecting portion of the fixing plate;
   a control circuit board, locked to a front side of the connecting plate;
   at least one coupling member, configured to fix the coupling portion of the connecting plate to the connecting portion of the fixing plate.

2. The programmable AC power distribution device as claimed in claim 1, wherein each of the connecting portion and the coupling portion is a plate.

3. The programmable AC power distribution device as claimed in claim 1, further comprising an insulating plate located between the connecting plate and the control circuit board.

4. The programmable AC power distribution device as claimed in claim 1, wherein the front side of the connecting plate is provided with a plurality of positioning protrusions, the control circuit board is provided with a plurality of through holes corresponding to the positioning protrusions, and the control circuit board is fixed to the positioning protrusions of the connecting plate through a plurality of locking members passing through the through holes.

5. The programmable AC power distribution device as claimed in claim 1, wherein the locking members are bolts, each positioning protrusion is a cylinder, and a locking hole is defined in each positioning protrusion.

6. The programmable AC power distribution device as claimed in claim 1, wherein left and right sides of the fixing plate are provided with a pair of second fixing portions for the fixing plate to be fixed to two sides of the case.

7. The programmable AC power distribution device as claimed in claim 1, wherein the coupling member is a bolt, the connecting portion of the fixing plate is provided with at least one locking hole, and the coupling portion of the connecting plate is provided with another locking hole corresponding to the locking hole of the connecting portion.

8. The programmable AC power distribution device as claimed in claim 1, wherein the fixing plate is provided with at least one engaging hole, the connecting plate is provided with at least one engaging piece corresponding to the engaging hole, and the engaging piece is configured to be engaged in the engaging hole.

9. The programmable AC power distribution device as claimed in claim 1, wherein the fixing plate is provided with at least one engaging portion for a bottom edge of the connecting plate to be engaged into the engaging portion.

* * * * *